(12) United States Patent
Patella et al.

(10) Patent No.: US 6,946,877 B2
(45) Date of Patent: Sep. 20, 2005

(54) CIRCUIT AND ASSOCIATED METHODOLOGY

(75) Inventors: Benjamin J. Patella, Fort Collins, CO (US); James C. Stout, Fort Collins, CO (US)

(73) Assignee: Hewlett-Packard Development Company, L.P., Houston, TX (US)

(*) Notice: Subject to any disclaimer, the term of this patent is extended or adjusted under 35 U.S.C. 154(b) by 96 days.

(21) Appl. No.: 10/735,415

(22) Filed: Dec. 12, 2003

(65) Prior Publication Data

US 2005/0127951 A1    Jun. 16, 2005

(51) Int. Cl.[7] .......................................... H03K 19/096
(52) U.S. Cl. ...................................... 326/95; 326/121
(58) Field of Search ......................... 326/95, 98, 112, 326/119, 121, 27, 28

(56) References Cited

U.S. PATENT DOCUMENTS 6,002,271 A * 12/1999 Chu et al. ..................... 326/98
6,201,425 B1 * 3/2001 Kartschoke et al. ........ 327/211
6,441,646 B1 * 8/2002 Braceras et al. .............. 326/98

* cited by examiner

Primary Examiner—James H. Cho (57) ABSTRACT

A method of interstitial pre-discharge in a circuit includes providing the circuit, which includes a pre-charge node coupled to a clock evaluate node operable to receive a clock evaluate input cycle. Multiple pull-down stacks each including an interstitial node interconnect between the pre-charge node and ground. The interstitial node of each pull-down stack couples to an interstitial discharger device gated to ground. The method further includes operating the circuit in a pre-charge phase of the clock evaluate input cycle, including pre-charging the pre-charge node and the interstitial nodes, and keeping the devices in the pull-down stacks and the interstitial dischargers in a high impedance state. The method additionally includes operating the circuit in an evaluate phase of the clock cycle, including discharging the pre-charge node to ground through a pull-down stack, and discharging the interstitial node to ground through the interstitial discharger device to preclude charge share.

19 Claims, 10 Drawing Sheets

FIG. 9

CIRCUIT AND ASSOCIATED METHODOLOGY

DESCRIPTION OF RELATED ART

In logic circuitry, the term "gate" refers to a circuit that implements a basic digital logic function. Examples of gates include AND, OR, inverter, and multiplex (mux) circuits. A domino mux gate circuit is commonly used to evaluate logic input signals, depending on the phase of an input clock cycle.

SUMMARY

In accordance with an embodiment, a circuit for evaluating logic level input signals is provided. The circuit includes a pre-charge node and a clock evaluate node coupled to cause charging of the pre-charge node in response to the logic level of the clock evaluate node. The circuit further includes an output node coupled to the pre-charge node through inverter logic circuitry and a plurality of logic input signal nodes configured to receive logic level input signals. The circuit further includes multiple pull-down stacks interconnected with the pre-charge node, each pull-down stack including an interstitial node and coupled to discharge the pre-charge node to ground in response to logic level input signals. The interstitial node of each pull-down stack couples to an interstitial pre-charger, which further couples to deliver charge to the interstitial node in response to the logic level of the clock evaluate node. The interstitial node additionally couples to an interstitial discharger, which is gated to ground and coupled to discharge the interstitial node to ground in response to the logic level of the clock evaluate node.

In accordance with another embodiment, a method of interstitial pre-discharge in a circuit with multiple pull-down stacks is provided. The method includes providing the circuit, which includes a pre-charge node and a clock evaluate node coupled to the pre-charge node and operable to receive a clock evaluate input cycle. Multiple pull-down stacks each including an interstitial node interconnect the pre-charge node and ground. The interstitial node of each pull-down stack couples to an interstitial discharger device, which is gated to ground. The method further includes operating the circuit in a pre-charge phase of the clock evaluate input cycle, including pre-charging the pre-charge node and the interstitial nodes, and keeping the devices in the pull-down stacks and the interstitial dischargers in a high impedance state. The method additionally includes operating the circuit in an evaluate phase of the clock cycle, including discharging the pre-charge node to ground through a pull-down stack, and discharging the interstitial node to ground through the interstitial discharger device to preclude a charge share event.

In accordance with yet another embodiment, a circuit is provided. The circuit includes means for storing a pre-charge and means for causing the pre-charge. The circuit further includes means for output coupled to the means for storing the pre-charge, means for receiving logic level input signals, and means for discharging to ground the means for storing the pre-charge in response to the logic level input signals. The circuit further includes the means for discharging coupled to means for pre-charging in response to the means for causing the pre-charge, and the means for discharging coupled to means for pre-discharging in response to the means for causing the pre-charge.

DETAILED DESCRIPTION

Figure 1:
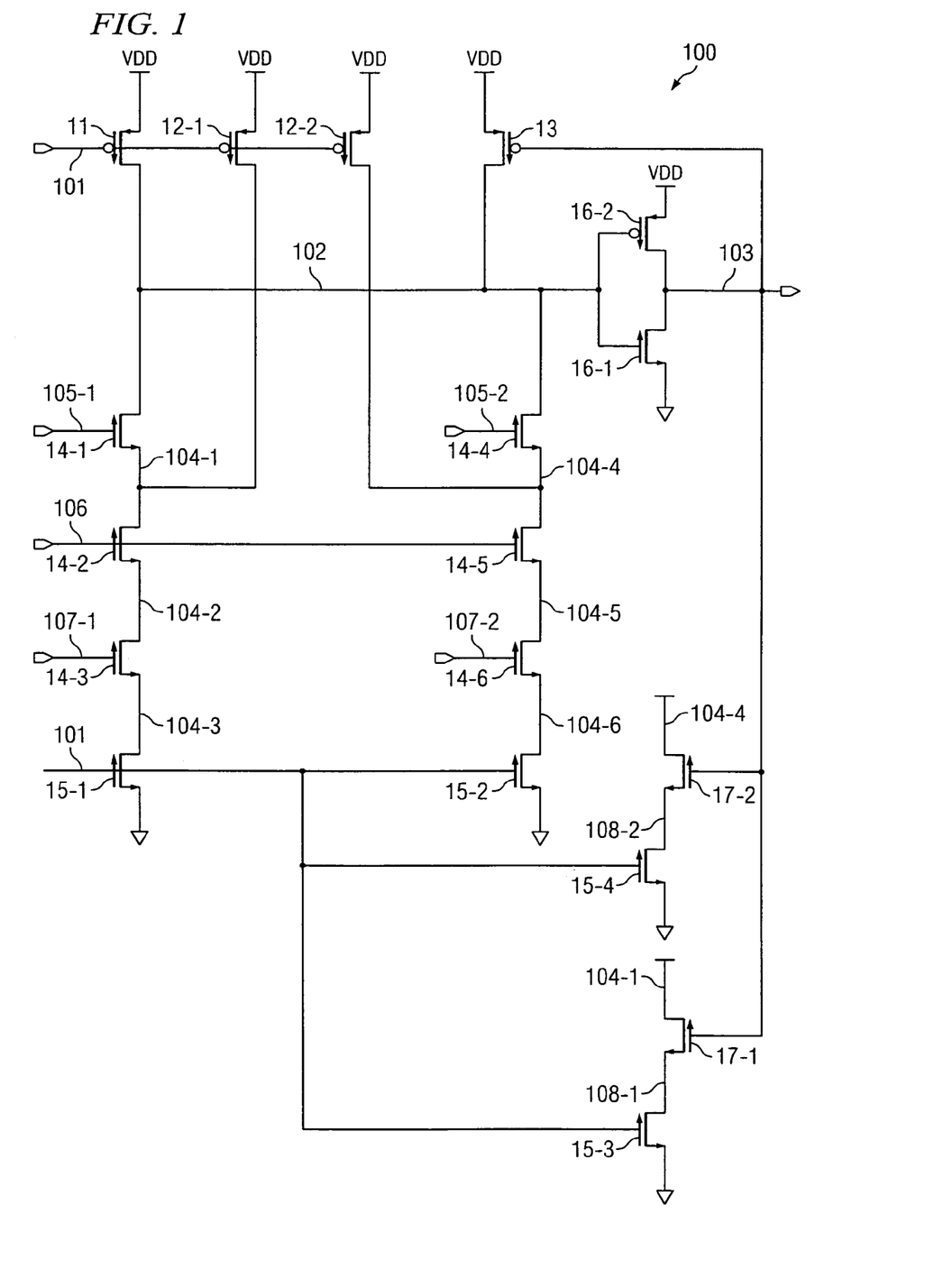
FIG. 1 shows a circuit embodiment including a domino type muxing structure logic gate with the addition of four Field Effect Transistors (FETs)

FIG. 1 shows circuit embodiment 100 including a domino-type multiplexing (muxing) structure logic gate with the addition of four Field Effect Transistors (FETs) 17-2, 15-4, 17-1 and 15-3. The term "gate" refers to a circuit that implements a basic digital logic function. Examples of gates include AND, OR, inverter, and mux circuits. The term "domino logic" is commonly interchangeably referred to as dynamic logic.

Other FETs in circuit 100 include FETs 11, 12-1, 12-2, 13. P-type FET (PFET) 13 is referred to as a "holder" or "keeper." Its purpose is to prevent the charge on pre-charge node 102 from leaking away through drain-to-source leakage during the evaluate clock phase. For example, if signal input nodes 105-1 and 105-2 are at ground, pre-charge node 102 is pre-charged to supply voltage VDD (logic 1), and clock evaluate node 101 transitioned to VDD, then pre-charge node 102 should remain at logic 1, but since the voltage on pre-charge node 102 is being held only by the charge stored on the capacitance of pre-charge node 102, in the absence of PFET 13 the charge will eventually leak away through the two high resistance paths to ground through n-type FET (NFET) pull-down stacks containing NFETS 14-1 to 14-6 and 15-1, 15-2.

An interstitial node is a term used in the art to describe a node between two FETs that are in series with one another. The purpose of PFETs 12-1 and 12-2 is to charge the capacitance on interstitial nodes 104-1 and 104-4 to VDD (logic 1) during the pre-charge phase of the clock signal 101. These PFETs are referred to as interstitial pre-chargers, because they serve to charge the capacitance of interstitial nodes of the circuit during the pre-charge phase of evaluate clock 101. The reason for pre-charging the interstitial nodes of the circuit is to avoid "charge sharing" between the interstitial nodes and pre-charge node 102 during the evaluate phase of evaluate clock 101. Other interstitial nodes in circuit 100 include nodes 104-2, 104-3, 104-5, 104-6, 108-1, and 108-2.

Figure 2:
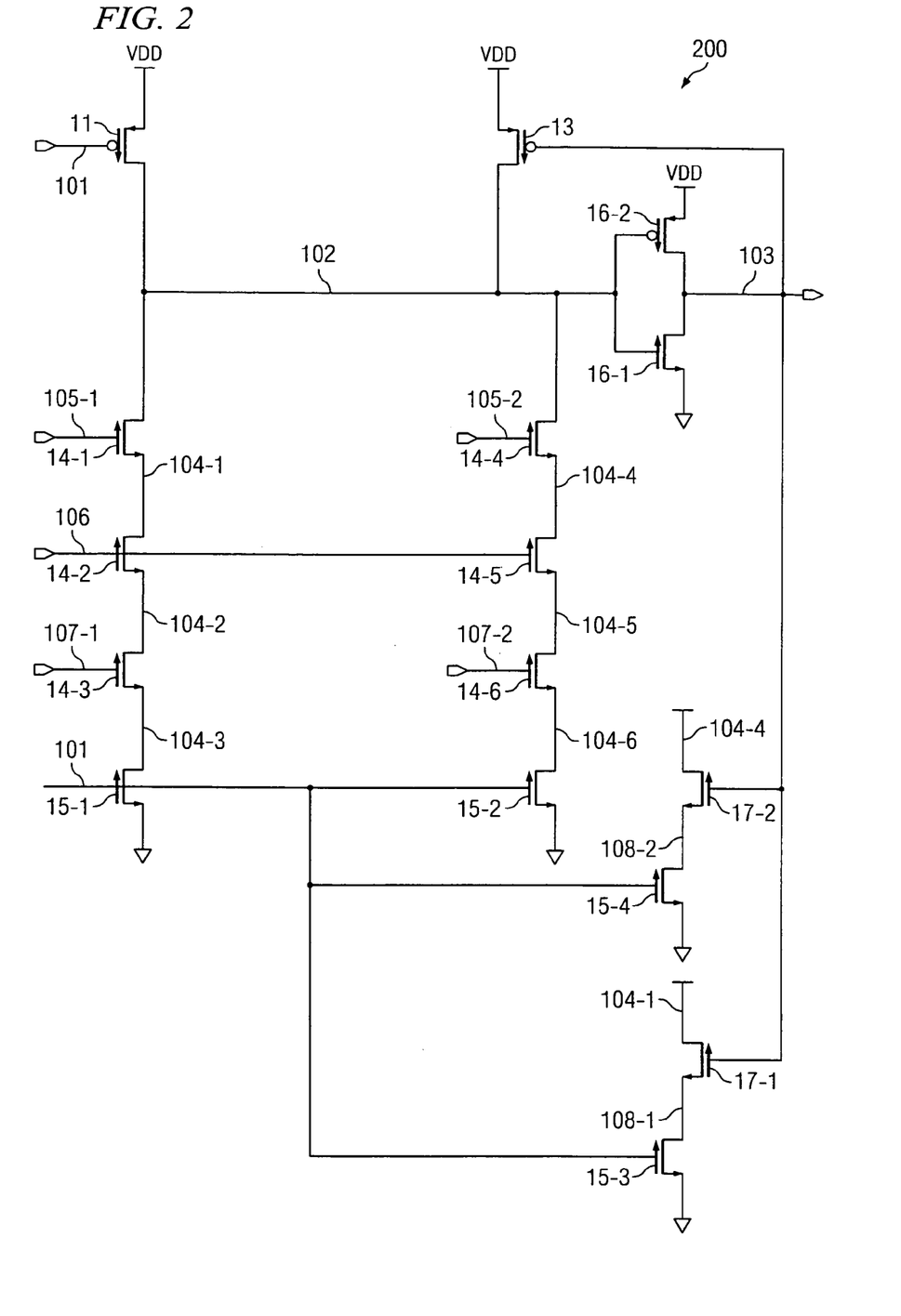
FIG. 2 shows a domino mux gate circuit similar to that of FIG. 1 but without the interstitial pre-charge p-type FETs (PFETs)

FIG. 2 shows domino mux gate circuit 200, similar to circuit 100 of FIG. 1 but without interstitial pre-charge p-type FETs (PFETs) 12-1 and 12-2. Circuit 200 has two modes of operation, namely pre-charge and evaluate. When "evaluate" clock signal 101 is at a low voltage (logic 0), the circuit is in pre-charge mode. During this phase of the clock cycle, PFET 11 forms a conductive channel, and pre-charge node 102 charges to supply voltage VDD (logic 1) through the channel of PFET 11. Pre-charge node 102 is coupled with output node 103 through an inverter logic subcircuit containing PFET 16-2 and NFET 16-1. By the end of the pre-charge phase, pre-charge node 102 reaches a high voltage at or near VDD, PFET 16-2 has no conductive channel, and n-type FET (NFET) 16-1 has formed a conductive channel. Thus output node 103 pre-discharges to a low voltage through the conductive channel of NFET 16-1. At the end of the pre-charge phase, the circuit is enabled to evaluate input logic signals.

When clock signal evaluate 101 is at a high voltage (logic 1), mux circuit 200 is said to be in an evaluate mode. During this mode of operation, logical evaluations are performed. This time period is referred to as the evaluate phase of the clock cycle. During the evaluate phase, if signal input nodes 105-1, 106 and 107-1 rise to a logic 1 level, then a conductive path is formed from pre-charge node 102 to the low voltage supply ground through NFETs 14-1, 14-2, 14-3 and 15-1, respectively, and pre-charge node 102 discharges to ground (logic 0). Similarly, during the evaluate phase of the clock cycle, if signal inputs 105-2, 106 and 107-2 rise to a logic 1 level, then a conductive path is formed from pre-charge node 102 to ground through NFETs 14-4, 14-5, 14-6 and 15-2, respectively, and pre-charge node 102 discharges to ground (logic 0). If neither of these two conditions occurs, pre-charge node 102 remains at or near VDD (logic 1). If pre-charge node 102 discharges to ground, then output node 103 will charge to VDD through PFET 16-2. Otherwise, output node 103 will remain at ground.

Figure 3:
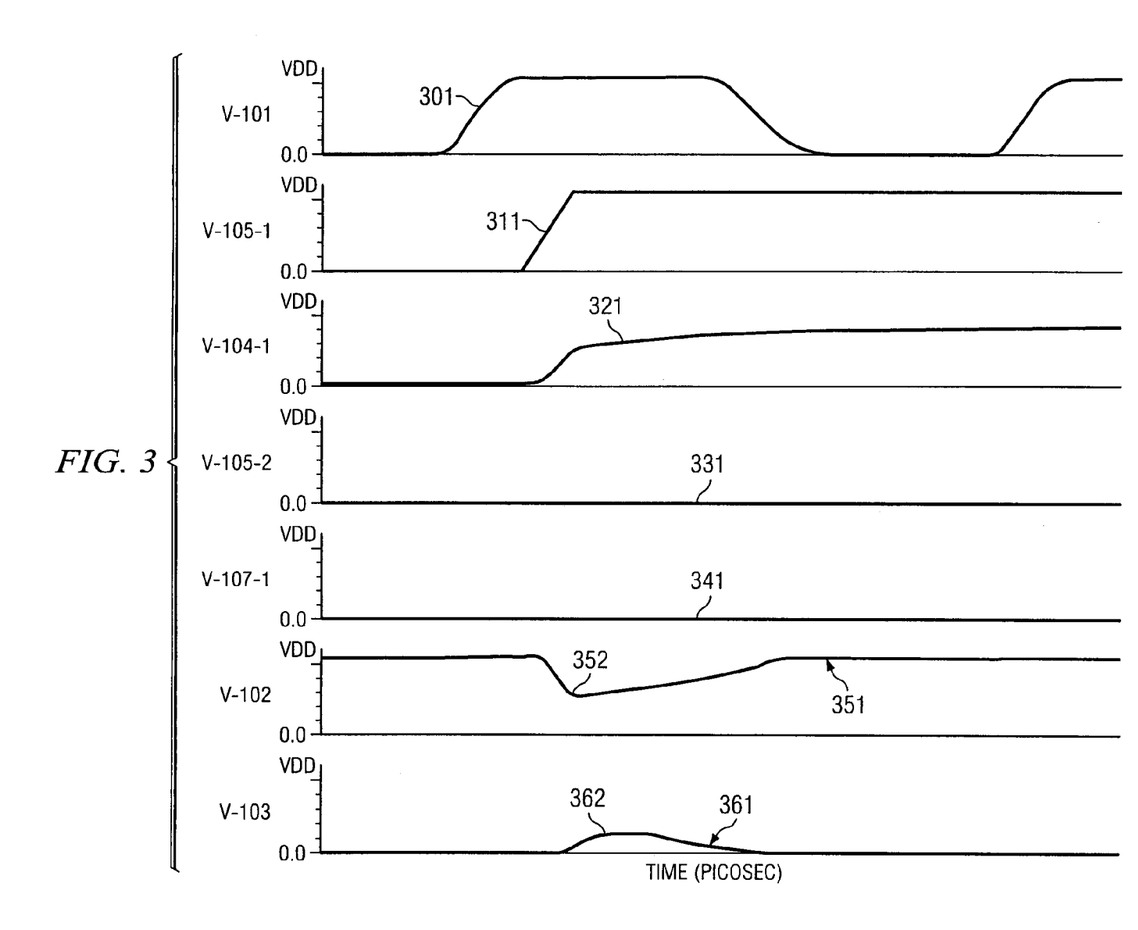
FIG. 3 shows a simulation timing diagram of operation of the circuit of FIG. 2, which demonstrates a charge share event.

FIG. 3 shows a simulation timing diagram of operation of circuit 200 of FIG. 2, which demonstrates a charge share event. For the simulations, the vertical axis is voltage and the horizontal axis is time. Most important are the general waveforms and how they relate to one another qualitatively in time. Less important are the absolute time scale on the x-axis and raw y-axis values. Circuit embodiments 100, 200, 400, 700, and corresponding timing diagrams herein relate to circuit topology and not to any specific implementation. The simulation waveforms illustrate general behavior via the operation of specific implementations, because they provide an easy way to capture timing relationships between important signals. The waveform diagrams are labeled only with zero volts and VDD on the y-axis and are labeled with time on the x-axis in picoseconds, but the scales can be interpreted as completely arbitrary, so long as the waveforms maintain consistent timing relationships with one another.

In the simulation depicted in FIG. 3, clock evaluate node 101 transitions to voltage V-101 equal to logic 1 in waveform 301, pre-charge node 102 is pre-charged to voltage V-102 equal to logic 1 in waveform 351, voltage V-104-1 is at logic 0 in waveform 321, voltage V-105-2 and voltage V-107-1 are at logic 0 in waveforms 331 and 341 respectively, and voltage V-105-1 transitions from logic 0 to logic 1 in waveform 311. Then current flows through the channel of NFET 14-1 from pre-charge node 102 to interstitial node 104-1. Charge (Q=CV) that was stored on the capacitance of pre-charge node 102 is shared with the capacitance of interstitial node 104-1. Because of conservation of charge, the voltage on pre-charge node 102 is seen to droop after the charge share event. The droop is described approximately by the equation:

$$V\text{-}102\_final = (C\text{-}102 * V\text{-}102\_initial) / (C\text{-}102 + C\text{-}105\text{-}1)$$

Charge sharing is undesirable, because logically pre-charge node 102 is intended to stay at logic 1, but the charge share causes V-102 to droop (point 352 in waveform 351) enough that V-103 rises (Point 362 in waveform 361). If V-103 rises to a voltage above the sensitivity threshold of downstream logic, the signal could be interpreted as a logic 1, whereas it is intended to be a logic 0.

Figure 4:
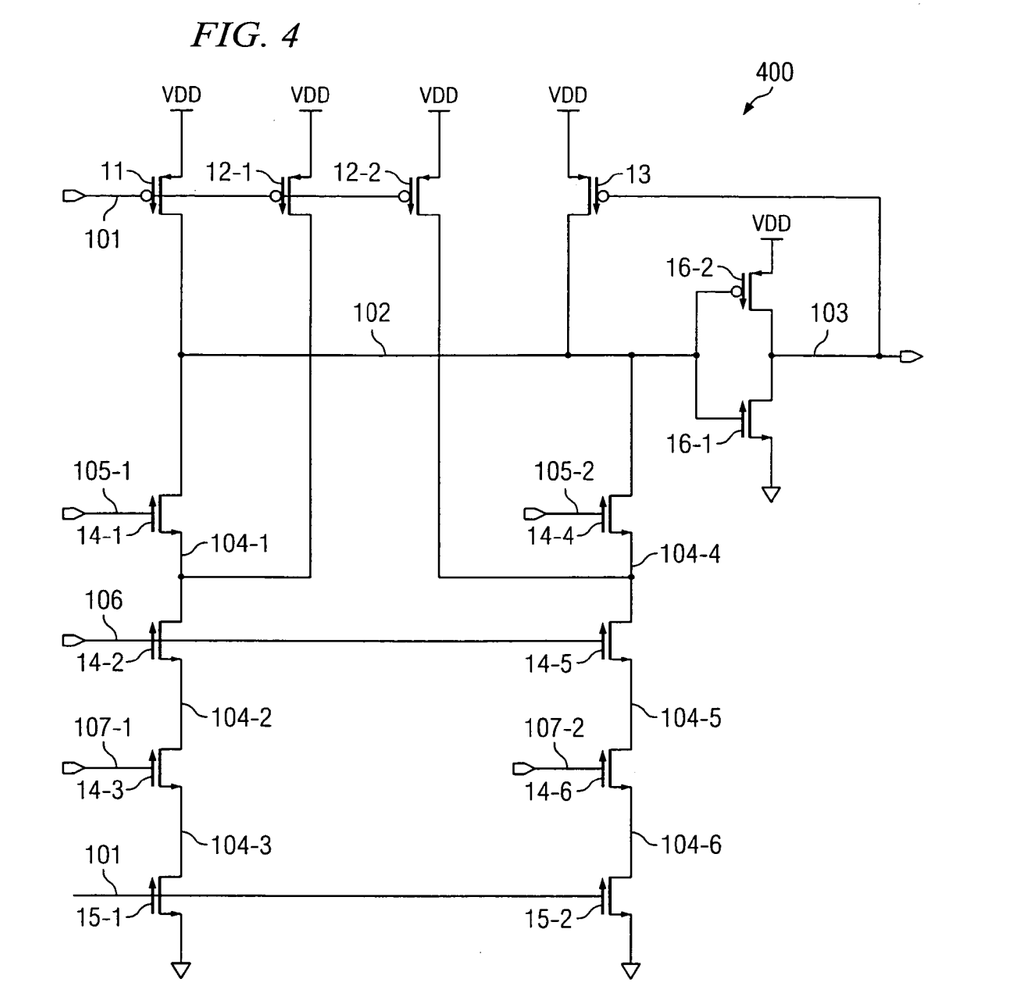
FIG. 4 shows a circuit similar to that of FIG. 1 but without predischarge and gating FETS, demonstrating another type of charge sharing.
Figure 5:
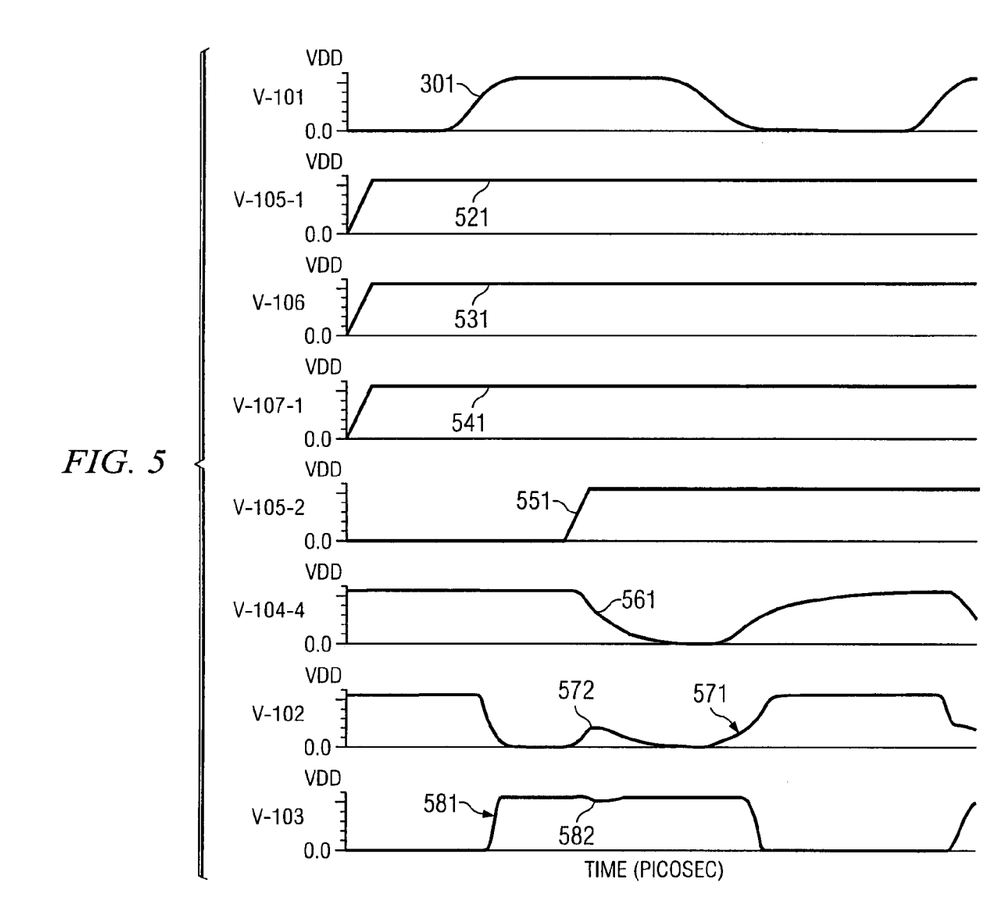
FIG. 5 shows simulation timing diagrams of the circuit of FIG. 4.

FIG. 4 shows circuit 400 similar to circuit 100 of FIG. 1 but without pre-discharge and gating FETS 15-3, 15-4, 17-1, and 17-2, demonstrating another type of charge sharing. FIG. 5 shows simulation timing diagrams of circuit 400: V-105-= logic 1, V-107-1=logic 1, V-106=logic 1, in respective waveforms 521, 531, and 541. Clock evaluate V-101 transitions to logic 1 in waveform 301, V-107-2=logic 0 (not shown) and V-105-2 goes high in waveform 551. Then the charge that was stored on the capacitance of nodes 104-4 and 104-5 shares with the capacitance of pre-charge node 102, i.e., current flows from nodes 104-5 and 104-4 to node 102 as depicted in waveform 561. This causes the voltage of pre-charge node 102 to rise (Point 572 in waveform 571). A rise in voltage V-102 on pre-charge node 102 causes voltage V-103 on output node 103 to drop (point 582 in waveform 581). This is an unintended behavior, since the voltage on output node 103 should stay at logic 1 until the next pre-charge phase.

Figure 6:
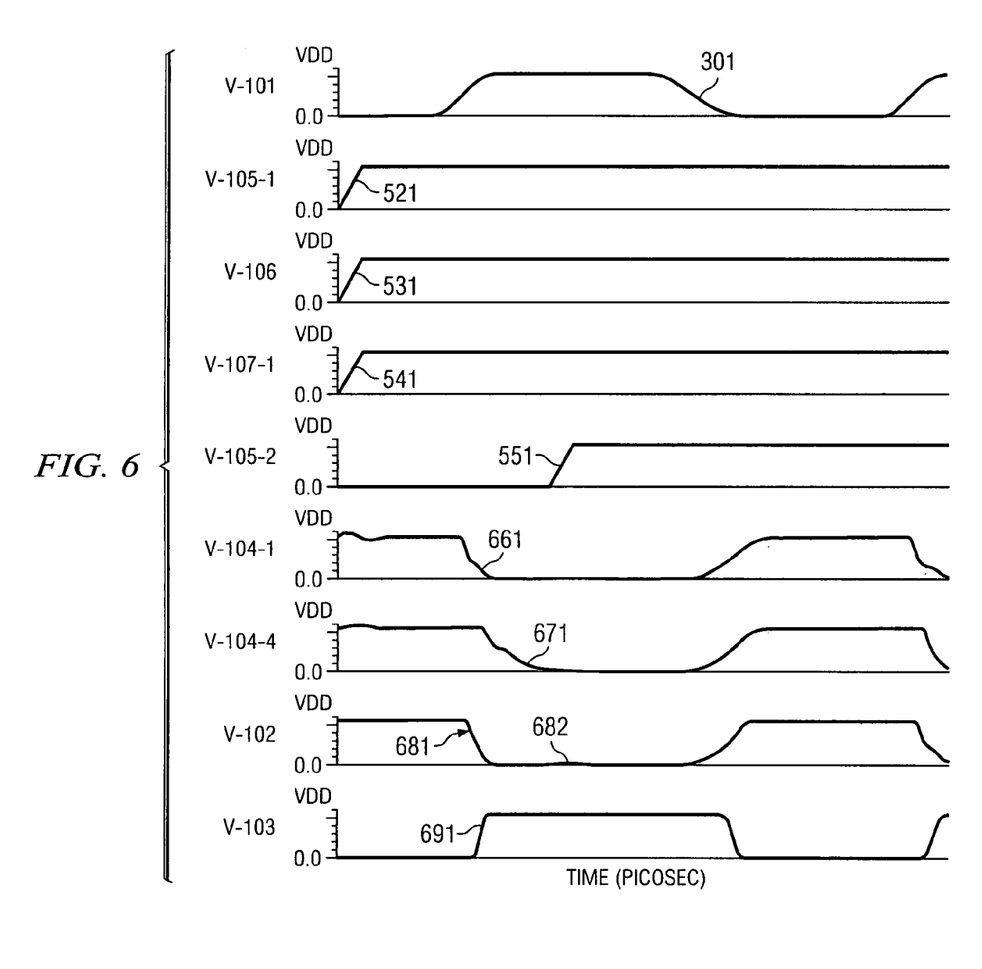
FIG. 6 shows simulation timing diagrams for the circuit of FIG. 1 with the same inputs as shown in FIG. 5.
Figure 7:
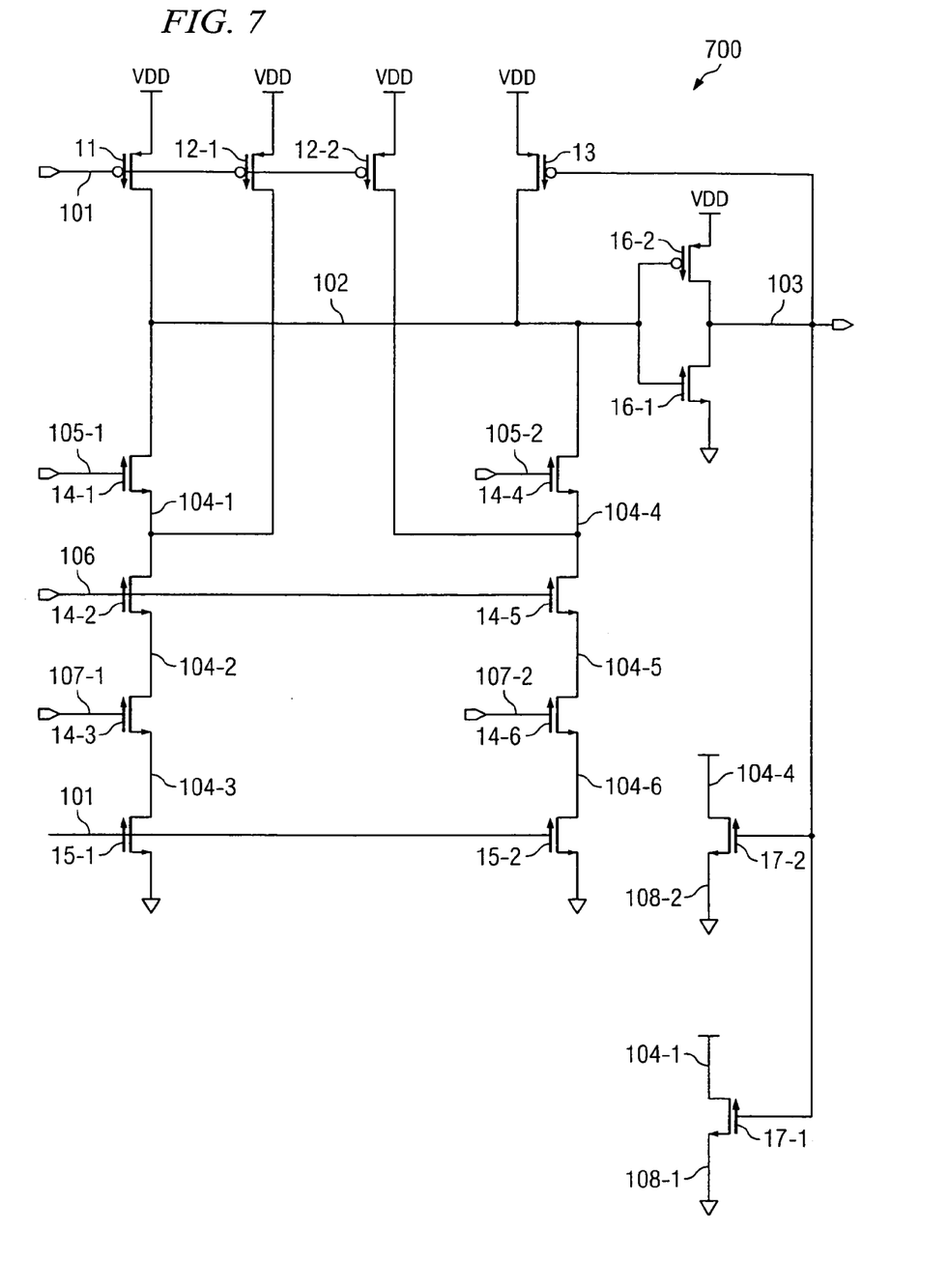
FIG. 7 shows a circuit similar to that of FIG. 1, but without gating FETs.

This charge sharing problem is addressed by the embodiments as illustrated, for example, in circuit 100 depicted in FIG. 1. In accordance with the embodiments, whenever pre-charge node 102 is pulled low, interstitial nodes 104-4 and 104-1 are discharged, precluding the possibility of charge sharing with pre-charge node 102 when pre-charge node 102 is low. FIG. 6 shows simulation timing diagrams of circuit 100 of FIG. 1 with the same inputs as in FIG. 5, namely V-107-1=logic 1 in timing diagram 541, V-106=logic 1 in timing diagram 531, evaluate V-101=logic 1 in timing diagram 301, V-107-2=logic 0 (not shown) and V-105-1 going high in timing diagram 521. With the inclusion of interstitial dischargers 17-2 and 17-1, the capacitances of interstitial nodes 104-1 and 104-4 are discharged in timing diagrams 661, 671 prior to respective input signals V-105-1 in timing diagram 521 or V-105-2 in timing diagram 551 going high. Therefore, there is no charge to couple onto pre-charge node 102, and no discontinuity in V-102 on pre-charge node 102 is observed (point 682 in timing diagram 681). Consequently, signal V-103 on output node 103 in timing diagram 691 remains at logic 1 and does not droop. In FIGS. 1, 2, and 7, for purposes of illustrating the circuit topology, interstitial node 104-1 is shown in two places once between FETs 14-1 and 14-2 and again in series with interstitial discharger 17-1. In the circuits, these occurrences both actually lie on a single node. Likewise, in FIGS. 1, 2, and 7, the two appearances of interstitial node 104-4 both actually lie on a single node.

Interstitial dischargers 17-2 and 17-1, are gated by respective evaluation FETs 15-4 and 15-3, precluding any drive fight between pre-charge FETs and interstitial dischargers 17-2 and 17-1. A drive fight occurs at a particular node in a circuit when two different drivers try to drive some common node that they share to two different voltages. "Driver" here can be from as simple as a single transistor up to a complex circuit. Drive fight is a term well known in the art.

Figure 8:
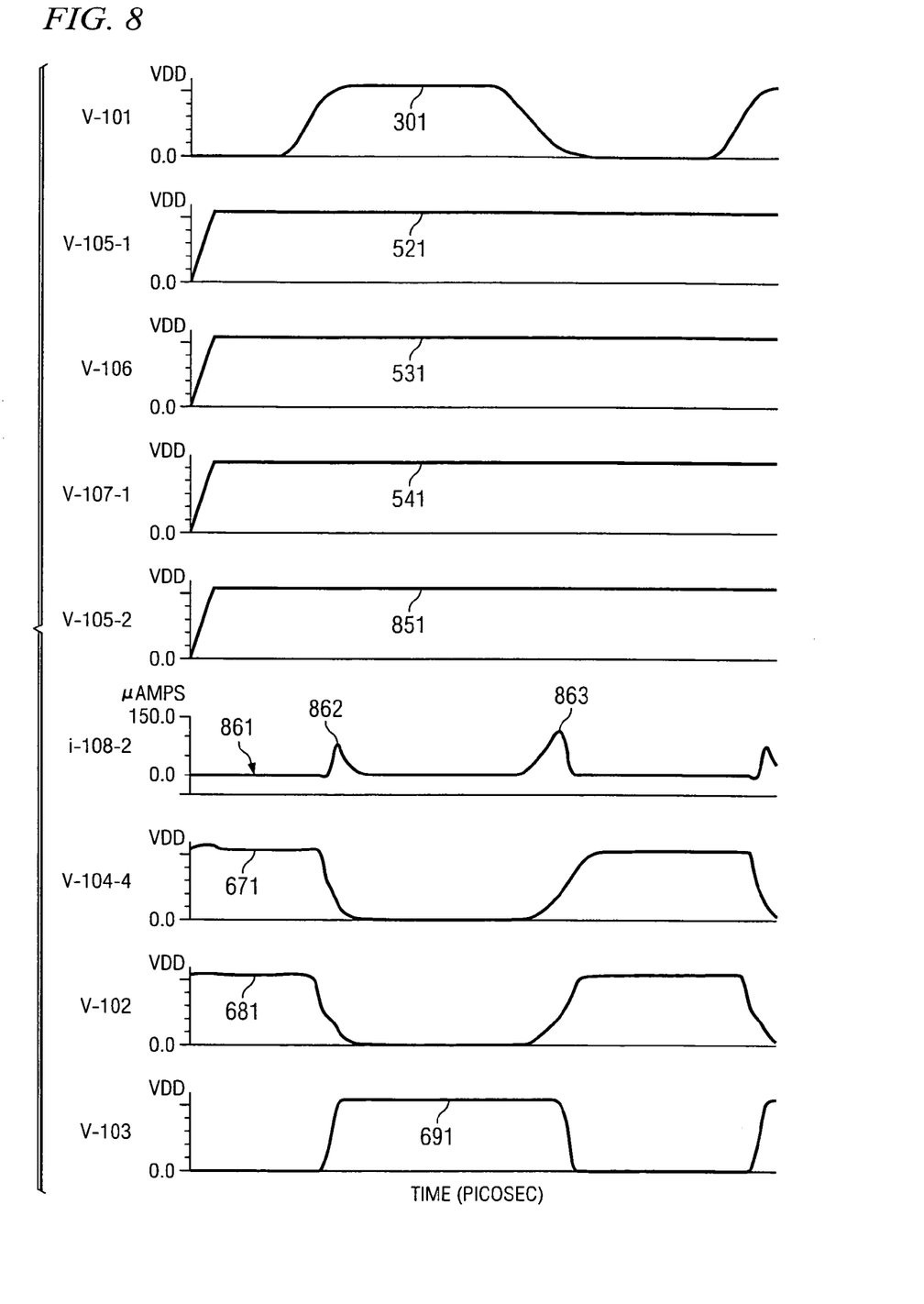
FIG. 8 shows simulation timing diagrams for the circuit of FIG. 7, which include a transient drive fight.

A drive fight occurs when there is a channel-connected (low resistance) path from VDD to ground. FIG. 7 shows circuit 700 similar to circuit 100, but without FETs 15-3 and 15-4. FIG. 8 shows simulation timing diagrams of circuit 700, which include a transient drive fight (Point 863 in waveform 861). All signal amplitudes in FIG. 8 represent voltage on a scale from zero to VDD, except signal i-108-2, which represents current waveform 861 into the drain of interstitial discharger NFET 17-2. In the simulation, pre-charge node V-102 transitions to logic 0 in waveform 681, input V-105-2= logic 1 in waveform 851, and evaluate clock 101 transitions from 1 to 0 in waveform 301. Initially, both FET 14-4 and interstitial discharger 17-2 have conductive channels. As V-102 rises (pre-charges), current flows through FET 14-4 and interstitial discharger 17-2 to ground. In the absence of evaluation FET 15-4, the drive fight is a transient event that lasts until output node 103 goes low in waveform 691 and shuts off interstitial discharger 17-2. Discharging of the interstitial node through interstitial discharger 17-2 due to circuit evaluation is demonstrated at Point 862 in waveform 861.

Figure 9:
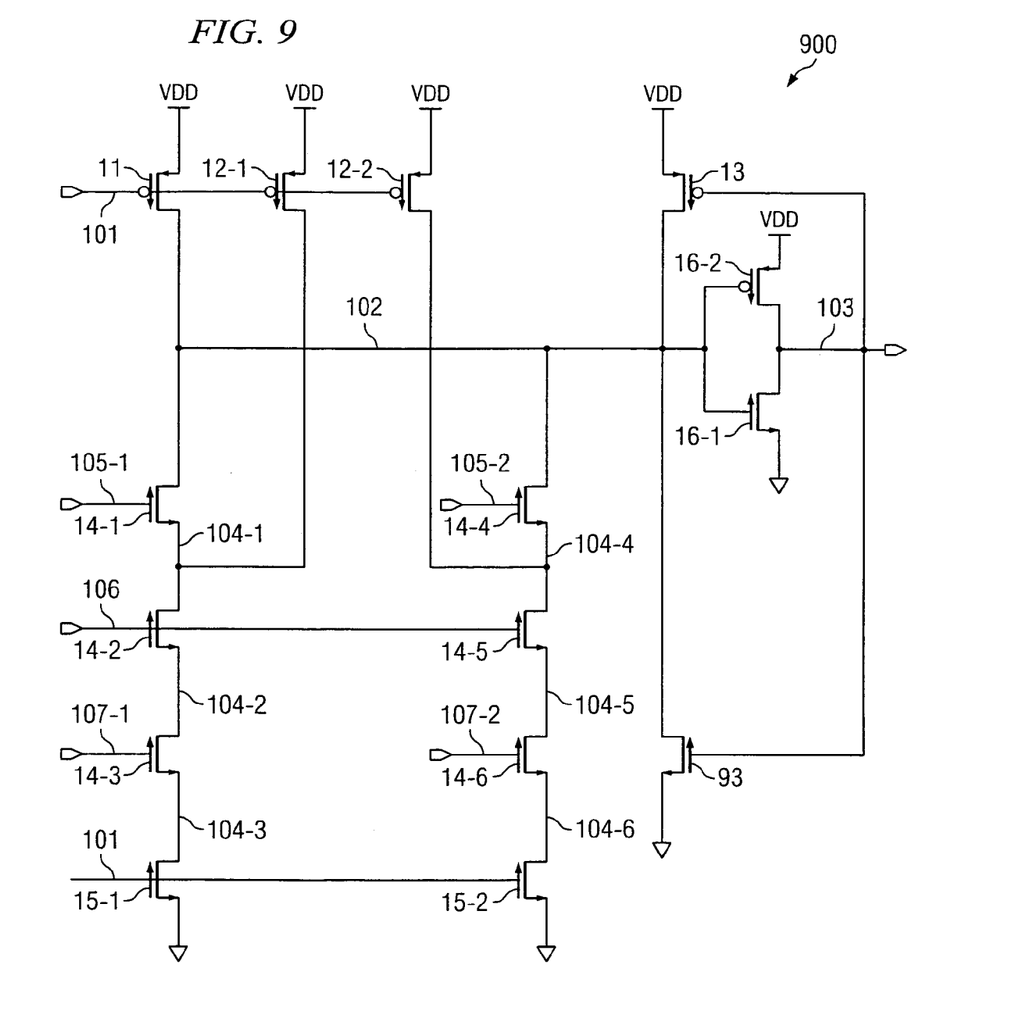
FIG. 9 shows a circuit including a full keeper, i.e. both PFET and NFET holders on a pre-charge node.

Alternative techniques to those of circuit 100 that have been employed include:

FIG. 9 shows circuit 900, including a full keeper, i.e. both PFET 13 and NFET 93 holders on pre-charge node 102. However, NFET holder 93 needs to be quite large, i.e. the NFET gate width needs to be quite large, to significantly reduce the size of the unintended and unwanted voltage discontinuity on pre-charge node 102. This adversely increases the capacitive loading on pre-charge node 102, thus increasing the evaluation time of pre-charge node 102. Evaluation time is the delay from the time an input, e.g. 105-1 or 105-2, rises until output node 103 rises. Increased capacitive loading also adversely increases pre-charge time, because the pre-charge FET 12-1 and 12-2 must fight against NFET keeper 93 to pre-charge node 102 high. Pre-charge time is the time delay from the falling edge of evaluate clock V-101 to the rising edge of pre-charge signal V-102.

Increasing the trip point of output inverter subcircuit including PFET 16-2 and NFET 16-1. This subcircuit implements the logical function of inversion. The trip point of the output inverter is defined as the voltage on node 102 required to drive the output to that same voltage. The greater the width of PFET 16-2, the higher the trip point of the inverter, because of the relatively lower effective resistance of the wider PFET channel. This higher trip point adversely increases susceptibility to noise and charge sharing on pre-charge node 102 when node 102 is high.

The embodiments solve the problem of charge sharing of positive charge from interstitial nodes 104-1 and 104-2 to pre-charge node 102 of a domino gate circuit, for example circuit 100, during the evaluation phase, preventing an undesired rising voltage discontinuity on pre-charge node 102 that could otherwise produce an undesired voltage droop on output node 103.

Figure 10:
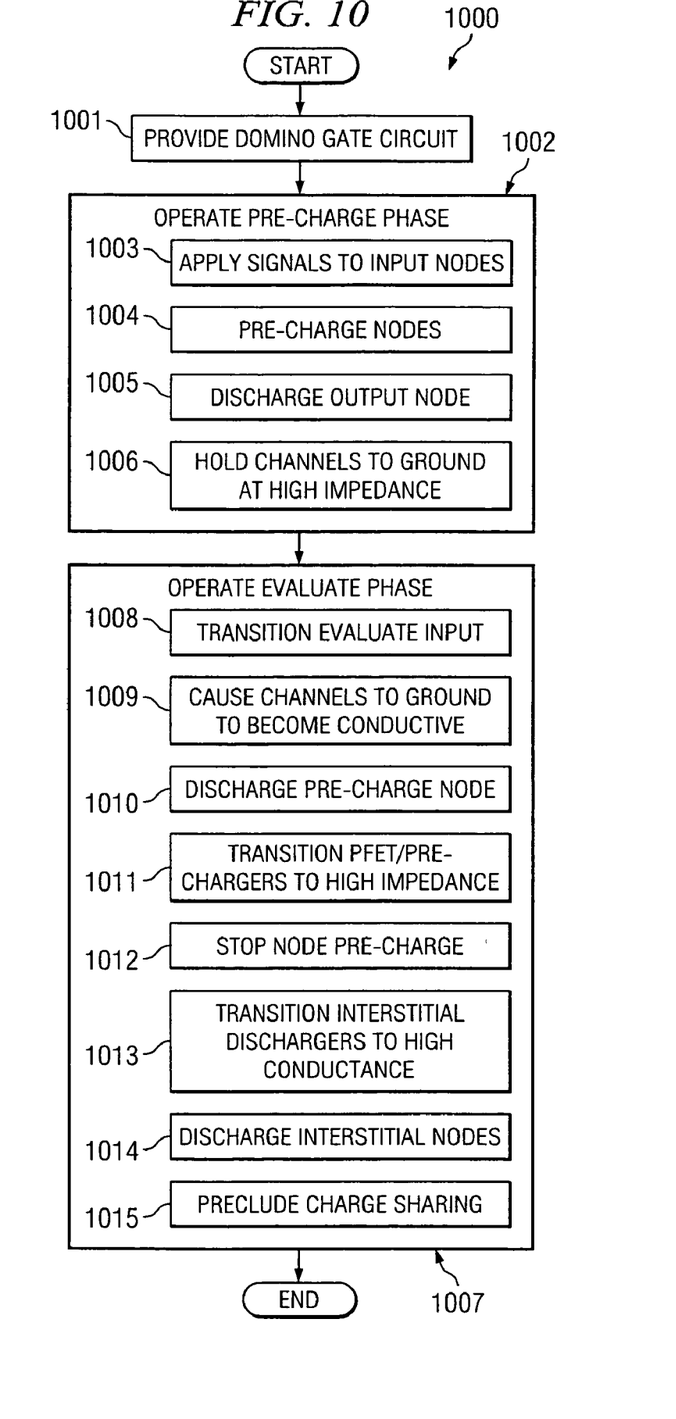
FIG. 10 is a flow diagram depicting an operational sequence of a domino gate circuit with multiple pull-down stacks using a gated interstitial pre-discharge, in accordance with circuit embodiments herein.

FIG. 10 is a flow diagram depicting operational sequence 1000 of a domino gate circuit, for example circuit 100, with multiple pull-down stacks using a gated interstitial pre-discharge, in accordance with circuit embodiments herein. In operation 1001, domino gate circuit 100 is provided, which includes multiple pull-down stacks, clock evaluate input node 101, multiple logic signal input nodes, for example signal input nodes 105-1, 105-2, 106, 107-1, and 107-2. Circuit 100 additionally includes pre-charge node 102, output node 103, and interstitial nodes, for example interstitial nodes 104-1 and 104-4 connecting adjacent FETs within the multiple pull-down stacks. Interstitial nodes 104-1 and 104-4 are individually interconnected with respective interstitial pre-chargers 12-1 and 12-2 and with respective interstitial dischargers 17-1 and 17-2, which are gated to ground through respective evaluation FETs 15-3 and 15-4.

In an example pre-charge phase, as depicted in operation 1002, evaluate input node 101 and signal input nodes 105-2, 107-2 are at logic 0, and signal input nodes 105-1, 106, and 107-1 are all held at logic 1 (i.e., VDD) in operation 1003. This causes pre-charge node 102 and interstitial nodes 104-1 and 104-4 to be pre-charged to logic 1 through pre-chargers 12-1 and 12-2 and through PFET 11 respectively in operation 1004. Output node 103 consequently discharges to logic 0 in operation 1005. Channels to ground through the pull-down stacks and through the evaluation FETs are all held in a high impedance (low conductance) condition by connecting their respective gates to evaluate input node 101 in operation 1006.

In an example evaluate phase, as depicted in operation 1007, evaluate input node 101 transitions from logic 0 to logic 1 in operation 1008, causing channels to ground through pull-down stacks and evaluation FETs to become conductive in operation 1009. Pre-charge node 102 then discharges to logic 0 (ground) through one of the pull-down stacks in operation 1010, causing output node 103 to charge to logic 1 in operation 1010. Concurrently PFET 11 and pre-chargers 12-1 and 12-2 transition to high impedance in operation 1011, stopping pre-charge of pre-charge node 102 and the interstitial nodes in operation 1012, and interstitial dischargers 17-1 and 17-2 transition to high conductance in operation 1013, causing the interstitial nodes to discharge to logic level 0 (ground) in operation 1014, which in operation 1015 precludes charge sharing that could otherwise adversely introduce a voltage droop on output node 103.

What is claimed is:

1. A circuit for evaluating logic level input signals, said circuit comprising:

a pre-charge node;

a clock evaluate node coupled to cause charging of said pre-charge node in response to the logic level of said clock evaluate node;

an output node coupled to said pre-charge node through an inverter logic subcircuit;

a plurality of logic input signal nodes configured to receive logic level input signals; and multiple pull-down stacks interconnected with said pre-charge node, each said pull-down stack comprising an interstitial node and coupled to discharge said pre-charge node to ground in response to said logic level input signals;

said interstitial node of each said pull-down stack coupled to an interstitial pre-charger device, said interstitial pre-charger device further coupled to deliver charge to said interstitial node in response to the logic level of said clock evaluate node; and said interstitial node coupled to an interstitial discharger device, said interstitial discharger device gated to ground and coupled to discharge said interstitial node to ground in response to said logic level of said clock evaluate node.

2. The circuit of claim 1 wherein said circuit is a domino-type multiplexing structure logic gate circuit.

3. The circuit of claim 1 comprising a pre-charge field effect transistor (FET) having a gate interconnected with said clock evaluate node and having a channel interconnected between said pre-charge node and a voltage supply.

4. The circuit of claim 1 wherein said pull-down stack comprises a first pull-down FET and a second pull-down FET, said first pull-down FET having a gate connected to a first logic input signal node, said second pull-down FET having a gate connected to a second logic input signal node different from said first logic input signal node, and said first and said second pull-down FETs having respective channels interconnected together in series through said interstitial node.

5. The circuit of claim 4 wherein said interstitial pre-charger device is a pre-charge FET having a gate interconnected with said clock evaluate node and having a channel interconnecting said interstitial node with said voltage supply.

6. The circuit of claim 4 wherein said interstitial discharger device comprises a first FET and a second FET, said first FET having a gate connected to said output node and a channel interconnected in series between said interstitial node and ground through a channel of said second FET, said second FET having a gate connected to said clock evaluate node.

7. The circuit of claim 1 further comprising a keeper FET device having a gate connected to said output node and having a channel interconnected between said pre-charge node and said voltage supply.

8. A method of interstitial pre-discharge in a circuit with multiple pull-down stacks, said method comprising:
    providing a circuit comprising:
        a pre-charge node;
        a clock evaluate node operable to receive a clock evaluate input cycle, said clock evaluate node coupled to said pre-charge node;
        said multiple pull-down stacks interconnecting said pre-charge node and ground, said pull-down stacks each comprising an interstitial node; and
        said interstitial node of each said pull-down stack coupled to an interstitial discharger device, said interstitial discharger device gated to ground;
    operating said circuit in a pre-charge phase of said clock evaluate input cycle, comprising:
        pre-charging said pre-charge node and said interstitial nodes; and
        keeping devices in said pull-down stacks and said interstitial dischargers in a high impedance (low conductance) state;
    operating said circuit in an evaluate phase of said clock evaluate input cycle, comprising:
        discharging said pre-charge node to ground through a said pull-down stack; and
        discharging said interstitial node to ground through said interstitial discharger device, thereby precluding a charge share event.

9. The method of claim 8 wherein said pre-charging said pre-charge node is performed in response to a logic signal level on said clock evaluate node.

10. The method of claim 8 wherein said pre-charging said interstitial nodes is performed in response to said logic signal level on said clock evaluate node.

11. The method of claim 8 wherein said circuit further comprises a plurality of logic input signal nodes and wherein said maintaining said channels to ground through said pull-down stacks in a high impedance (low conductance) condition is performed in response to logic signal levels on said plurality of logic input signal nodes.

12. The method of claim 11 wherein said discharging said pre-charge node to ground through one of said pull-down stacks comprises causing said channels to ground through said pull-down stack to become conductive.

13. The method of claim 12 wherein said causing said channels to ground through said pull-down stack to become conductive is performed in response to logic signal levels on said plurality of logic input signal nodes and in response to said logic signal level on said clock evaluate node.

14. The method of claim 8 wherein said circuit further comprises an output node coupled to said pre-charge node through an inverter logic subcircuit and wherein said maintaining said channels to ground through said interstitial discharger device in a high impedance (low conductance) condition is performed in response to a logic signal level on said output node and in response to said logic signal level on said clock evaluate node.

15. The method of claim 14 wherein said discharging said interstitial node to ground through said interstitial discharger device comprises transitioning of said channels to ground through said interstitial discharger device to a high conductance condition.

16. The method of claim 15 wherein said transitioning is performed in response to transitioning of said logic signal level on said output node and in response to transitioning of said logic signal level on said clock evaluate node.

17. The method of claim 8 further comprising pre-charging of said interstitial nodes during said pre-charge phase of said clock evaluate input cycle and omitting said pre-charging during said evaluate phase of said clock evaluate input cycle.

18. The method of claim 17 wherein said circuit comprises an interstitial node pre-charger device and wherein said pre-charging and said omitting said pre-charging is performed by transitioning the impedance through a channel of said pre-charger device in response to said logic signal level on said clock evaluate node.

19. A circuit comprising:
    means for storing a pre-charge;
    means for causing said pre-charge;
    means for output coupled to said means for storing said pre-charge;
    means for receiving logic level input signals; and
    means for discharging to ground said means for storing said pre-charge in response to said logic level input signals;
    said means for discharging coupled to means for pre-charging in response to said means for causing said pre-charge; and
    said means for discharging coupled to means for pre-discharging in response to said means for causing said pre-charge.

* * * * *

UNITED STATES PATENT AND TRADEMARK OFFICE
CERTIFICATE OF CORRECTION

PATENT NO. : 6,946,877 B2  
APPLICATION NO. : 10/735415  
DATED : September 20, 2005  
INVENTOR(S) : Benjamin J. Patella et al.

It is certified that error appears in the above-identified patent and that said Letters Patent is hereby corrected as shown below:

In column 4, line 20, delete "V-105-=" and insert -- V-105-1= --, therefor.

Signed and Sealed this

Eleventh Day of August, 2009

David J. Kappos  
*Director of the United States Patent and Trademark Office*